United States Patent
Hegazy et al.

(10) Patent No.: US 12,182,487 B2
(45) Date of Patent: Dec. 31, 2024

(54) CONTROLLABLE PATTERN CLUSTERING FOR CHARACTERIZED SEMICONDUCTOR LAYOUT DESIGNS

(71) Applicant: Siemens Industry Software Inc., Plano, TX (US)

(72) Inventors: Hazem Hegazy, Cairo (EG); Ahmed Hamed Fathi Hamed, Giza (EG); Omar ElSewefy, Giza (EG); Sara Khalaf, Cairo (EG)

(73) Assignee: Siemens Industry Software Inc., Plano, TX (US)

( * ) Notice: Subject to any disclaimer, the term of this patent is extended or adjusted under 35 U.S.C. 154(b) by 462 days.

(21) Appl. No.: 17/461,636

(22) Filed: Aug. 30, 2021

(65) Prior Publication Data
US 2023/0069262 A1 Mar. 2, 2023

(51) Int. Cl.
*G06F 30/39* (2020.01)
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC ........ G06F 30/30; G06F 30/39; G06F 30/392; G06F 30/398
USPC ........................................................ 716/112
See application file for complete search history.

(56) References Cited

U.S. PATENT DOCUMENTS

| | | | |
|---|---|---|---|
| 8,458,623 | B1 | 6/2013 | Wagner |
| 9,646,124 | B2 | 5/2017 | Chidambarrao et al. |
| 10,216,888 | B2 | 2/2019 | Kanshin et al. |
| 2004/0093165 | A1* | 5/2004 | Ohman ................ C07K 14/721 435/6.19 |
| 2005/0185159 | A1 | 8/2005 | Rosenbluth et al. |
| 2006/0277520 | A1 | 12/2006 | Gennari |
| 2014/0089877 | A1 | 3/2014 | Salem et al. |
| 2014/0215416 | A1 | 7/2014 | Sahouria |

(Continued)

OTHER PUBLICATIONS

Jason P. Cain, Moutaz Fakhry, Piyush Pathak, Jason Sweis, Frank E. Gennari, Ya-Chieh Lai, "Pattern-based analytics to estimate and track yield risk of designs down to ?nm" Proc. SPIE 10148, Design-Process-Technology Co-optimization for Manufacturability XI. Mar. 30, 2017.

*Primary Examiner* — Paul Dinh (57) ABSTRACT

A computing system implementing a physical verification tool can determine principal feature components describing geometric patterns around points of interest in a semiconductor layout design. The principal feature components include topological features indicating whether structures are present around the points of interest, and include dimensional features corresponding to measurements associated with the structures present around the points of interest. The physical verification tool can generate a topological signature for each of the points of interest based on the topological features, and cluster the points of interest into different subsets based on the topological signature. The physical verification tool can perform design rule check operations on the semiconductor layout design to identify whether one or more of the points of interest correspond to a design rule violation and perform pattern matching to identify whether other points of interest match the point of interest corresponding to the design rule violation.

17 Claims, 10 Drawing Sheets

(56) References Cited

U.S. PATENT DOCUMENTS

| | | |
|---|---|---|
| 2018/0307791 A1 | 10/2018 | Mousa et al. |
| 2018/0365370 A1 | 12/2018 | Egan et al. |
| 2019/0087526 A1 | 3/2019 | Park et al. |
| 2019/0155142 A1 | 5/2019 | Lai |
| 2020/0143099 A1 | 5/2020 | Wu et al. |
| 2021/0064717 A1* | 3/2021 | Hegazy ............... G06F 30/398 |
| 2022/0390831 A1* | 12/2022 | Rittman ............... G06F 30/398 |

* cited by examiner

CONTROLLABLE PATTERN CLUSTERING FOR CHARACTERIZED SEMICONDUCTOR LAYOUT DESIGNS

TECHNICAL FIELD

This application is generally related to electronic design automation and, more specifically, to controllable pattern clustering for characterized semiconductor layout designs.

BACKGROUND

In a design flow for fabricating integrated circuits, a physical design of an integrated circuit can describe specific geometric elements, often referred to as a layout design. The geometric elements, which typically are polygons, define the shapes that will be created in various materials to manufacture the integrated circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Descriptions for physical designs of integrated circuits can be provided in many different formats, such as a Graphic Data System II (GDSII) format, an Open Access format, a Milkyway format, component-level netlist EDDM format, and Open Artwork System Interchange Standard (OASIS) format. These various industry formats can be used to define the geometrical information in layout designs employed to manufacture integrated circuits. Some of the formats, such as the GDSII format, can include a hierarchy of structures, each having layout elements, for example, polygons, paths, poly-lines, circles, textboxes, or the like. Once the layout design is finalized, a reticle or mask can be generated from the layout design, which can be used to manufacture the integrated circuits using a photolithographic process.

Since certain geometric shapes in a layout design of an integrated circuit can be difficult, if not impossible, to manufacture with a given process, a designer often performs a number of physical verification analyses on the layout design to identify those geometric shapes and remove them from the layout design or modify them in such a way mitigating the impact on the manufacturing process. For example, one type of physical verification analysis—Design Rule Checking (DRC)—compares patterns of structures in the layout designs against various design rules. As manufacturing advances have allowed feature sizes of integrated circuits to decrease, one-dimensional design rule checks have been mostly replaced with multidimensional design rule checks that apply complex design rules to different patterns of structures in the layout designs. These complex design rules can be difficult to generate and typically consume memory and processing resources during the DRC analysis.

Rather than utilizing complex design rules, the multidimensional design rule checks can instead be performed using pattern matching by comparing portions of the layout design, often represented as captured images, against known problematic patterns, for example, expressed directly in a natural two-dimensional (2D) graphical language, to determine whether the portions of the layout design match the known problematic patterns. While pattern matching used for multidimensional design rule checks can identify problematic portions of the layout design, the image-based and pixel-based matching process consumes memory and processing resources to determine matches.

SUMMARY

This application discloses a computing system implementing a physical verification tool to determine principal feature components that describe geometric patterns around points of interest in a semiconductor layout design. The principal feature components include a plurality of topological features and a plurality of dimensional features for each of the points of interest in the semiconductor layout design. The topological features can indicate a presence of structures in different directions around the points of interest, and the dimensional features can correspond to measurements associated with the structures present around the points of interest. The physical verification tool can generate a topological signature for each of the points of interest based on the topological features, and cluster the points of interest into different subsets based on the topological signature. This topological signature can be a dimensionless representation of a set of patterns that share a same parent topology and vary in dimensional features. The physical verification tool can perform design rule check operations on the semiconductor layout design to identify whether one or more of the points of interest correspond to a design rule violation and perform pattern matching to identify whether other points of interest match the point of interest corresponding to the design rule violation. The performance of the pattern matching can identify which of the dimensional features corresponds to the design rule violation. Embodiments of will be described below in greater detail.

DETAILED DESCRIPTION

Illustrative Operating Environment

Figure 1:
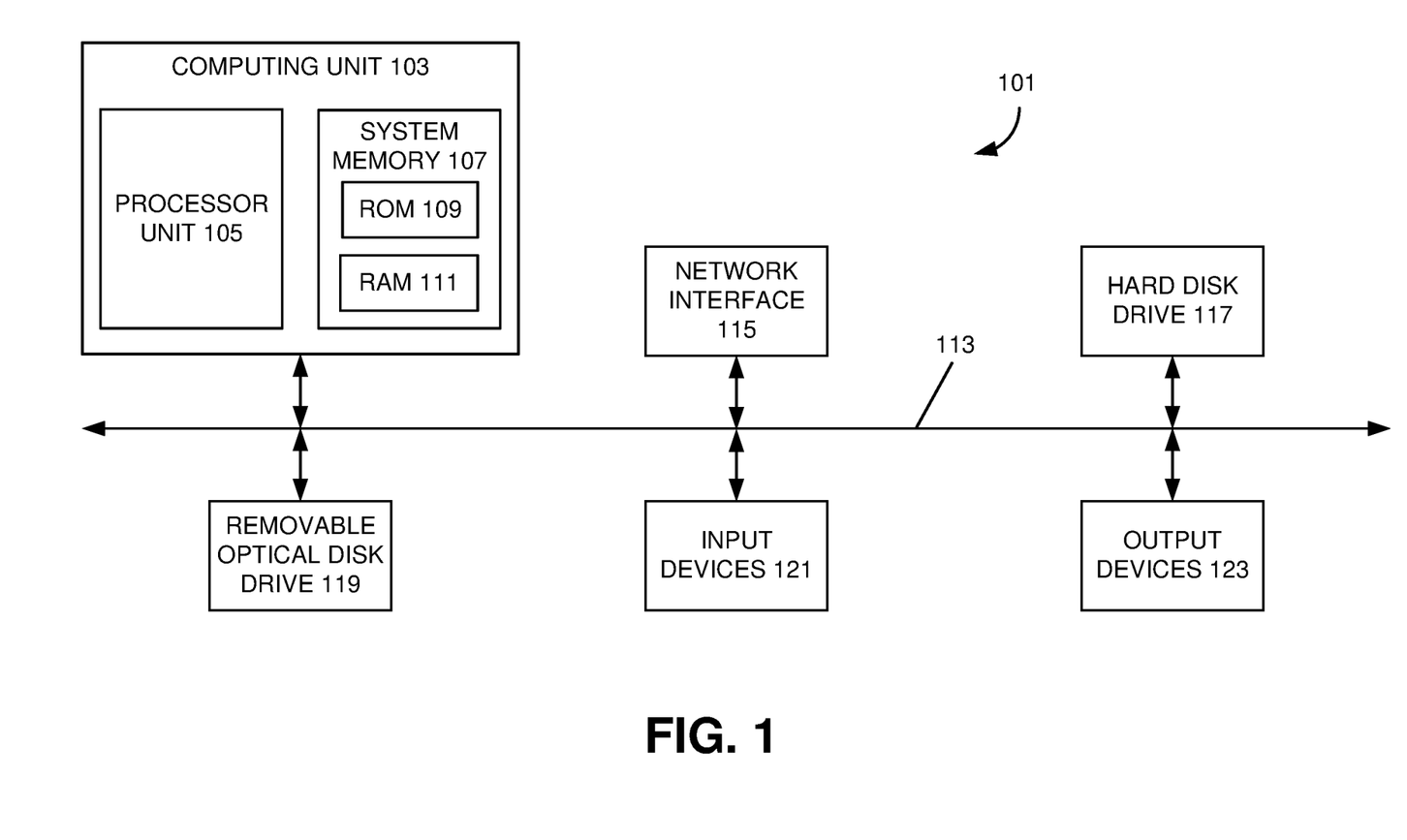
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processor unit 105 and a system memory 107. The processor unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processor unit 105.

The processor unit 105 and the system memory 107 are connected, either directly or indirectly, through a bus 113 or alternate communication structure, to one or more peripheral devices 115-123. For example, the processor unit 105 or the system memory 107 may be directly or indirectly connected to one or more additional memory storage devices, such as a hard disk drive 117, which can be magnetic and/or removable, a removable optical disk drive 119, and/or a flash memory card. The processor unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
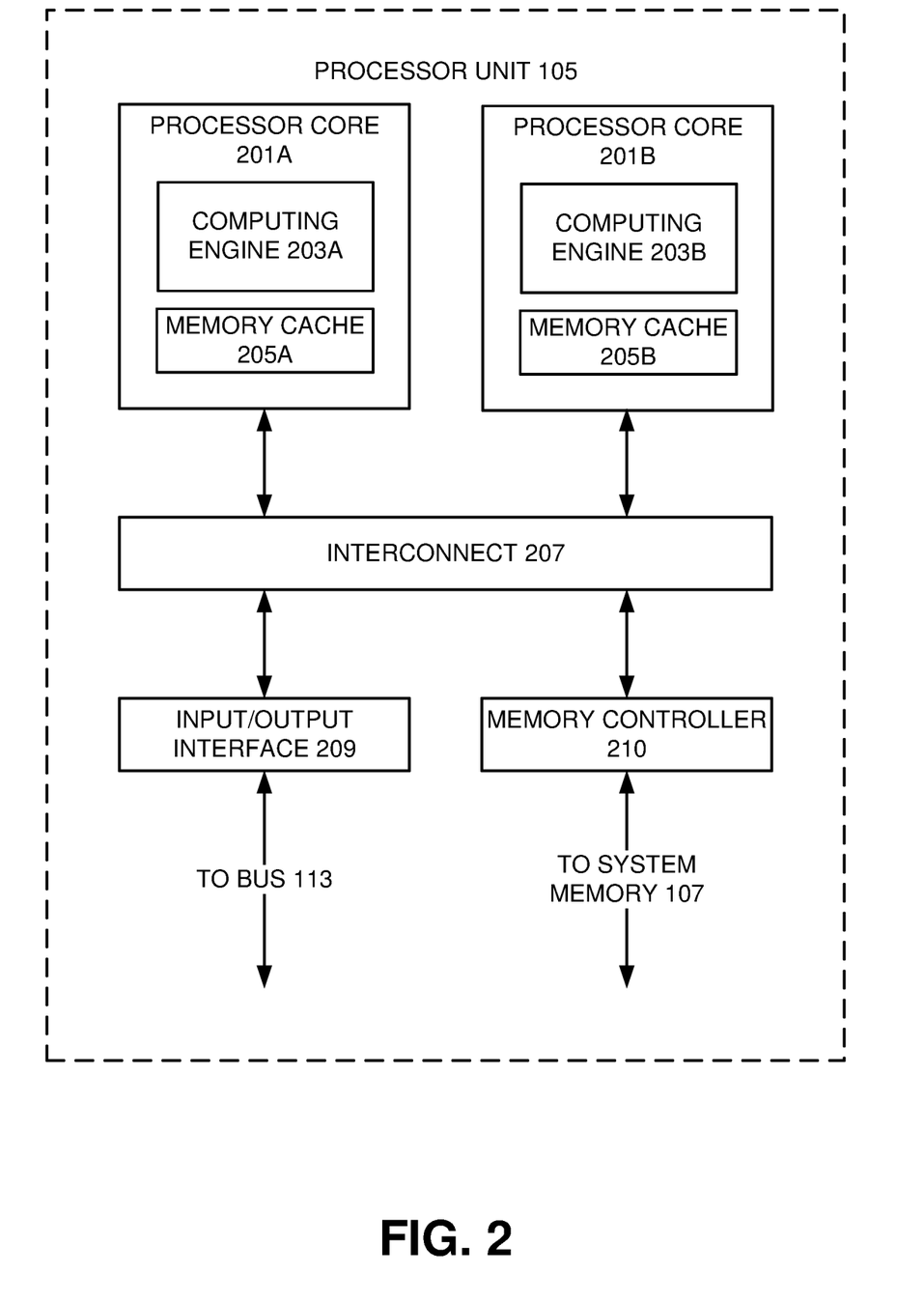

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, California, the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and is not intended to suggest any limitation as to the scope of use or functionality of alternate embodiments.

Controllable Pattern Clustering for Characterized Semiconductor Layout Designs

Figure 3:
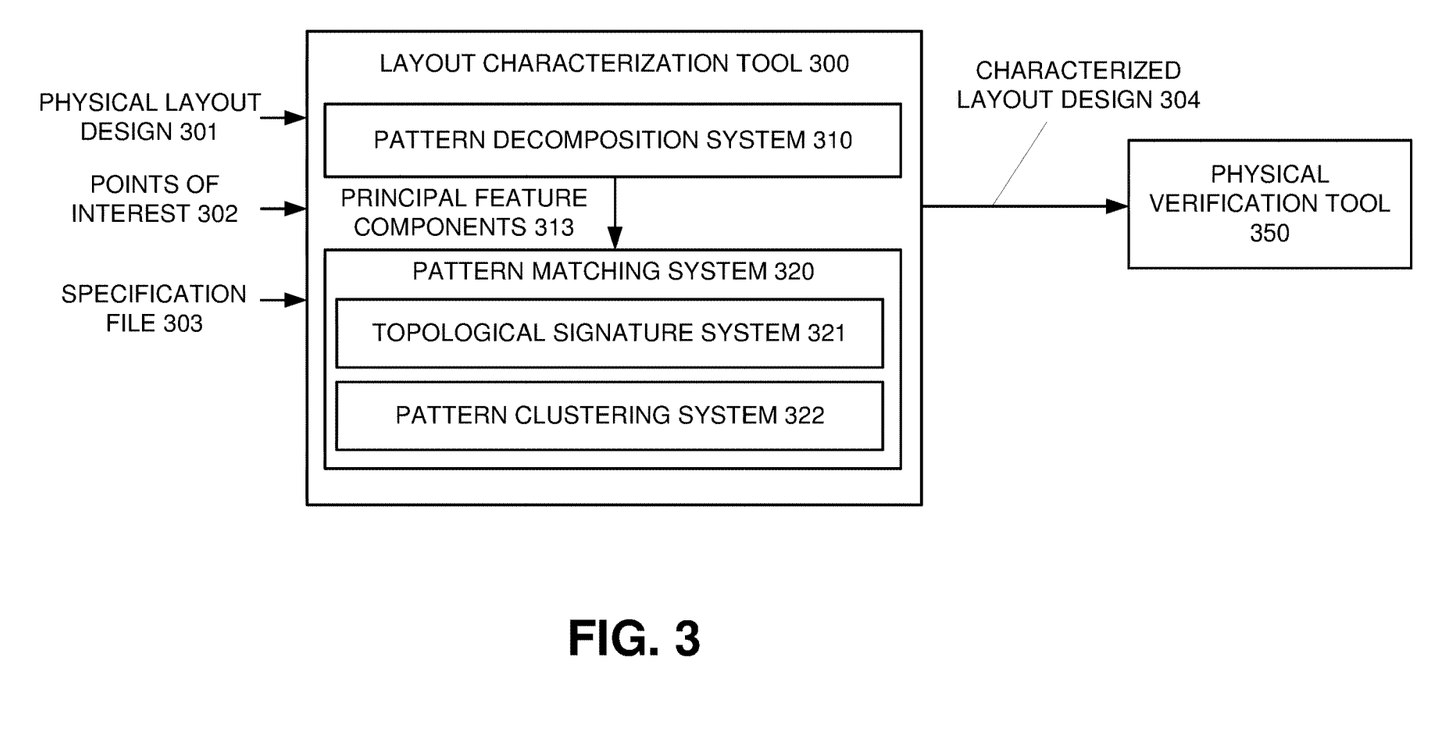
FIG. 3 illustrates an example layout characterization tool with controllable pattern clustering that may be implemented according to various embodiments.

FIG. 3 illustrates an example layout characterization tool 300 with controllable pattern clustering that may be implemented according to various embodiments. Referring to FIG. 3, the layout characterization tool 300, for example, implemented by the computing device 101 in FIG. 1, can receive a physical layout design 301 that describes an integrated circuit as geometric information defining the shapes, such as polygon structures, capable of being created in various materials to manufacture the integrated circuit. The physical layout design 301 can be specified in a Graphic Data System II (GDSII) format, an Open Access format, a Milkyway format, an EDDM format, an Open Artwork System Interchange Standard (OASIS) format, or the like.

The layout characterization tool 300 can receive points of interest 302 corresponding to portions of the physical layout design 301 to be characterized. In some embodiments, the points of interest 302 can correspond to portions of the physical layout design 301 associated with a hotspot, for example, those structures in the physical layout design 301 that could be difficult to manufacture. For example, one of the points of interest 302 can correspond to an end of a structure, which could experience pull-back or bridging caused due to light diffraction during manufacture of the integrated circuit described by the physical layout design 301. The points of interest 302 also can be placed at an edge of the physical layout design 301, for example, based on predefined selection criteria.

The layout characterization tool 300 can generate a characterized layout design 304 by identifying a context for the points of interest 302, for example, a description of the structures around the points of interest 302 in the physical layout design 301 based, at least in part, on a specification file 303. In some embodiments, the specification file 303 can identify directions around the points of interest 302 in the physical layout design 301 for the layout characterization tool 300 to inspect for structures, a depth of inspection in those directions, types of measurement to perform when a structure has been located, or the like. Embodiments of the layout characterization will be described below in greater detail.

The layout characterization tool 300 can provide the characterized layout design 304 to a physical verification tool 350, for example, downstream in a design flow for the physical layout design 301, such as a design rule checking tool or an optical proximity correction modeling tool. In some embodiments, the physical verification tool 350 can utilize the characterized layout design 304 to perform pattern matching operations, such as an exact match or a fuzzy match between different points of interest 302 in the characterized layout design 304. For example, when a design rule checking tool identifies a design rule violation corresponding to a point of interest in the characterized layout design 304, the design rule checking tool can utilize the characterized layout design 304 to identify other identical, topologically similar, or dimensionally similar points of interest in the characterized layout design 304, which can allow for a correction of the design rule violation to be propagated to all of the matching or similar structures.

The layout characterization tool 300 can include a pattern decomposition system 310 to generate principal feature components 313 for each of the points of interest 303 in the physical layout design 301. The principal feature components 313 can include topological components associated with the points of interest 303 in the physical layout design 301 and dimensional components associated with the points of interest 303 in the physical layout design 301. The topological components can include information identifying a presence of structures in different directions around the points of interest 303, for example, expressed as a binary value, a ternary value, or as quantized values represent quantized categories of characteristics for polygons around the point of interest 303, for example, corners types, path layout types, or the like. The dimensional components can include information corresponding to measurements of the points of interest 303 and/or of the structures identified by the topological components, for example, expressed as floating point values that describe the measurements. For example, the dimensional components can include floating point values that describe measurements of the points of interest 302, the identified structures, ordinal angles to the structures relative to the points of interest 302, the hypotenuse distances to the structures from the points of interest 302, or the like. In some embodiments, the pattern decomposition system 310 can generate the principal feature components 313 using an image capture system. Embodiments of the image capture system will be described below with reference to FIGS. 4A and 4B.

Figure 4A:
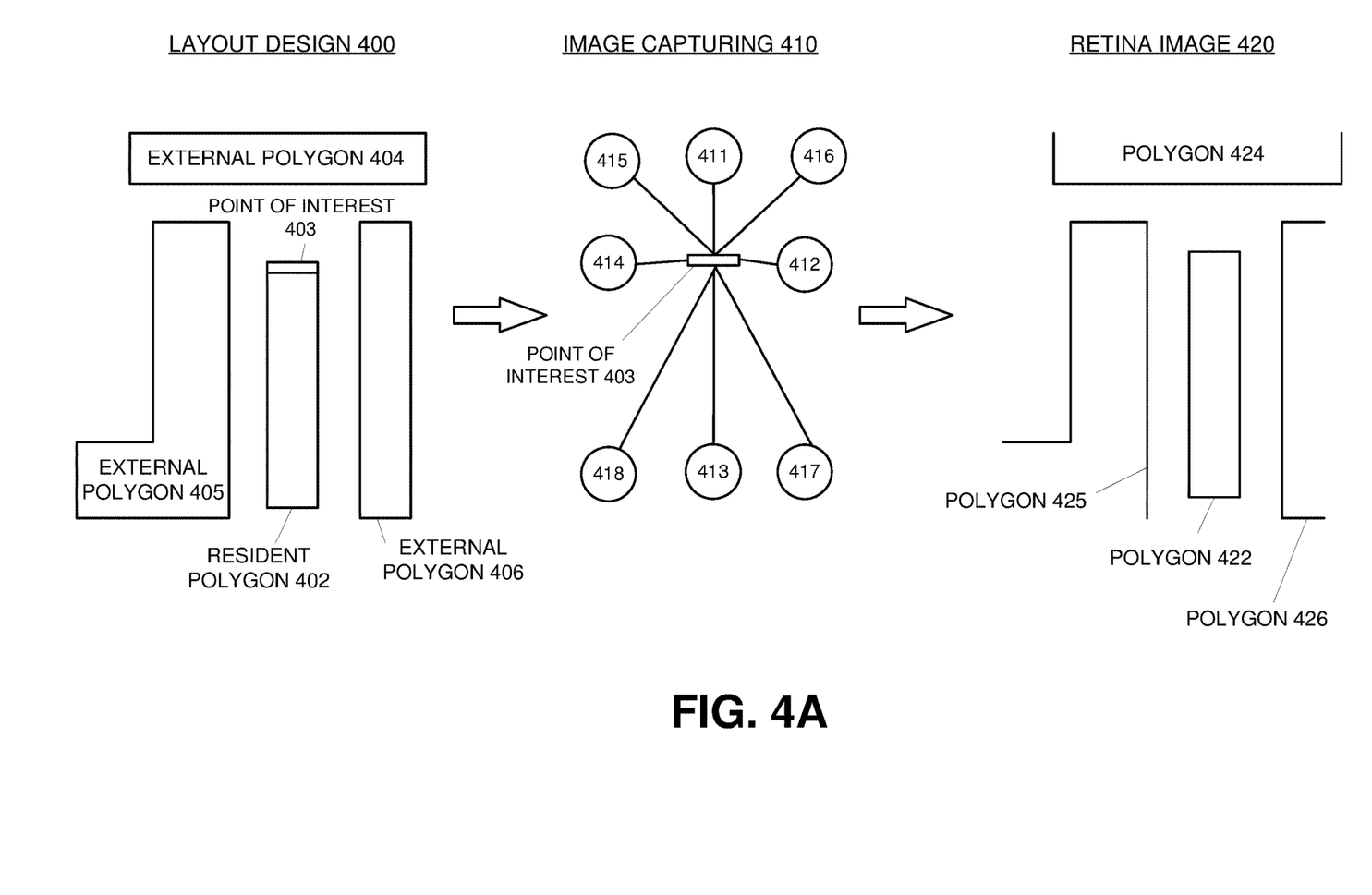
FIGS. 4A and 4B illustrate examples for image capture-based characterization of a layout design according to various embodiments.

FIGS. 4A and 4B illustrate examples for image capture-based characterization of a layout design according to various embodiments. Referring to FIG. 4A, a layout design 400 can include geometric information defining different polygon structures for a portion of an integrated circuit. In this example, the layout design 400 includes a resident polygon 402 having a point of interest 403 and multiple external polygons 404-406 around the resident polygon 402 and the point of interest 403.

A Geometrical Position Signature/Surveying process can utilize a camera, such as an edge-based camera, to capture geometrical images 410 at different locations 411-418 around the point of interest 403, for example, in the cardinal and ordinal directions relative to the point of interest 403. The locations 411-414 can correspond to geometrical images captured in the cardinal directions relative to the point of interest 403, while the locations 415-418 can correspond to geometrical images captured in ordinal directions relative to the point of interest 403. The geometrical images captured by the camera can be utilized to generate principal feature components, such as topological components and the dimensional components at the different locations 411-418.

The topological components and the dimensional components in the cardinal directions, for example, captured by with the edge-based camera during the global positioning surveying process, can be utilized to construct a retina image 420 of the layout design 400. For example, the topological components and the dimensional components corresponding to location 411 can be utilized in a construction of a polygon 424 in the retina image 420, which corresponds to the external polygon 404 in the layout design 400. The topological components and the dimensional components corresponding to location 412 can be utilized in a construction of polygons 422 and 426 in the retina image 420, which corresponds to the resident polygon 402 and external polygon 406 in the layout design 400, respectively. The topological components and the dimensional components corresponding to location 413 can be utilized in a construction of a polygon 422 in the retina image 420, which corresponds to the resident polygon 402 in the layout design 400. The topological components and the dimensional components corresponding to location 414 can be utilized in a construction of polygons 422 and 425 in the retina image 420, which corresponds to the resident polygon 402 and external polygon 405 in the layout design 400, respectively.

The topological components and the dimensional components in the ordinal directions, for example, captured by with the edge-based camera during the global positioning surveying process, can be used to identify corner information for the polygons 402, 404, 405, and 406 in the retina image 420. The topological components and the dimensional components corresponding to location 415 can be utilized to identify corners associated with polygons 424 and 425 in the retina image 420, which corresponds to the external polygon 404 and 405 in the layout design 400, respectively. The topological components and the dimensional components corresponding to location 416 can be utilized to identify corners associated with polygons 424 and 426 in the retina image 420, which corresponds to the external polygon 404 and 406 in the layout design 400, respectively. The topological components and the dimensional components corresponding to location 417 can be utilized to identify corners associated with polygons 422 and 426 in the retina image 420, which corresponds to the resident polygon 402 and external 406 in the layout design 400, respectively. The topological components and the dimensional components corresponding to location 418 can be utilized to identify corners associated with polygons 422 and 425 in the retina image 420, which corresponds to the resident polygon 402 and external 405 in the layout design 400, respectively.

Figure 4B:
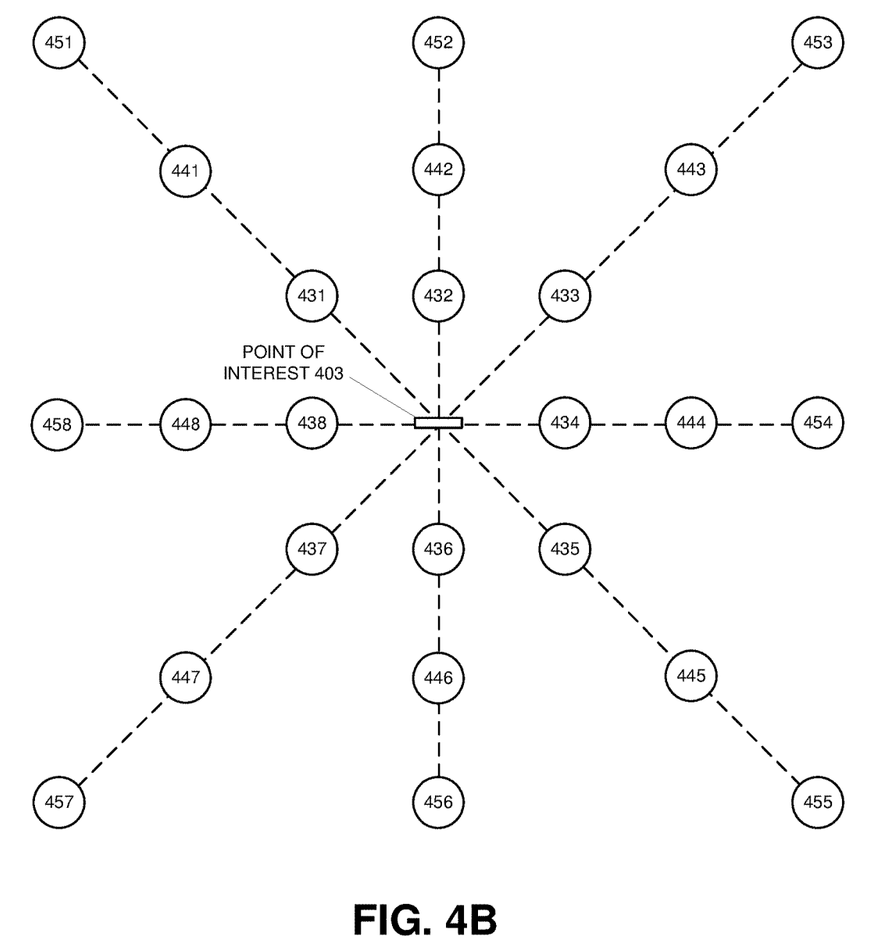

Referring to FIG. 4B, a global positioning surveying process also can utilize the camera to capture images around the point of interest 403 at locations having different relative depths. For example, locations 431-438 can correspond to images captured in the cardinal and ordinal directions relative to the point of interest 403 at a first set of distances from the point of interest 403. The locations 441-448 can correspond to images captured in the cardinal and ordinal directions relative to the point of interest 403 at a second set of distances from the point of interest 403. The locations 451-458 can correspond to images captured in the cardinal and ordinal directions relative to the point of interest 403 at a third set of distances from the point of interest 403. In this example, the first set of distances can be closer to the point of interest 403 than the second set of distances and the third set of distances, while the second set of distances can be closer to the point of interest 403 than the third set of distances. The topological components and the dimensional components in the cardinal directions, for example, captured by with the edge-based camera during the global positioning surveying process, can be utilized to construct a retina image 420 of the layout design 400.

Referring back to FIG. 3, the pattern decomposition system 310 can utilize the identification of structures in the physical layout design 301 during the global position surveying process to perform additional characterization of the patterns around the points of interest 302 and add those additional characteristics to the principal feature components 313 of the points of interest 302 as dimensional components. In some embodiments, the pattern decomposition system 310 can measure ordinal angles associated with locations of identified structures and the points of interest 302. Each ordinal angle can correspond to a measured angle between two cardinal directions that corresponds to a location of an identified structure. The pattern decomposition system 310 also can measure distances between the points of interested 302 and the identified structures along the ordinal angles. The decomposition system 310 also can measure the size of the points of interest 302, such as a length, a width, a shape, or the like of each of the points of interest 302, and the size of the identified structures, such as a length, a width, a shape, or the like, of each of the identified structures. Embodiments of pattern decomposition with an example via layout will be described below in greater detail with reference to FIGS. 5A-5C.

Figure 5A:
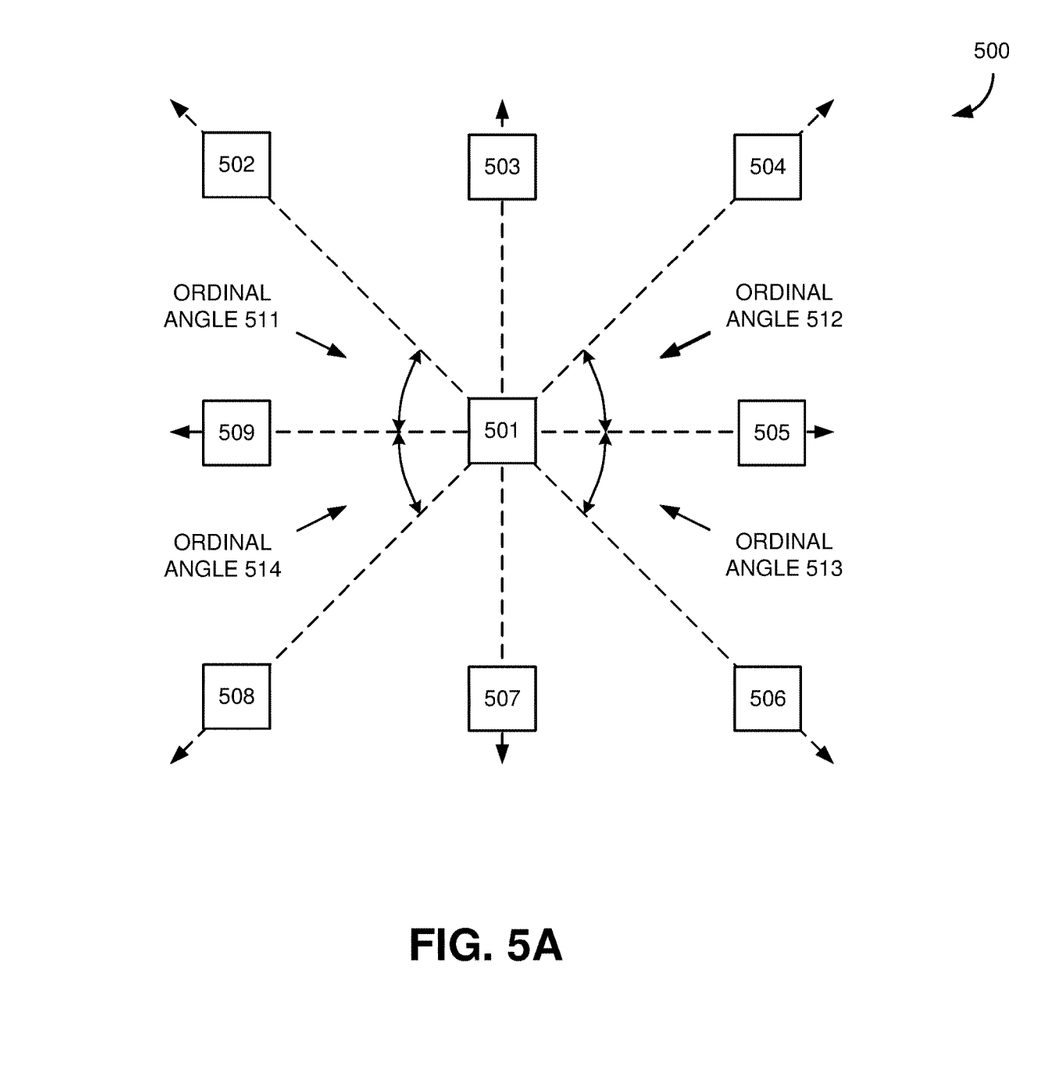
FIGS. 5A-5C illustrate examples of topological components for a point of interest in a layout design of an integrated circuit according to various examples.

FIGS. 5A-5C illustrate examples of topological components for a point of interest in a layout design of an integrated circuit according to various examples. Referring to FIG. 5A, a portion of a physical layout design 500 can include a point of interest 501 and multiple identified structures 502-509 located in different directions around the point of interest 501. The identified structures 503, 505, 507, and 509 can be located in cardinal directions around the point of interest 501, which the identified structures 502, 504, 506, and 508 can be located in ordinal directions around the point of interest 501.

A layout characterization tool can measure ordinal angles 511-514 that correspond to directions of the identified structures 502, 504, 506, and 508 relative to the point of interest 501. For example, the identified structure 502 can be located in an ordinal direction between the cardinal directions associated with structures 503 and 509 and, in some embodiments, the layout characterization tool can measure the ordinal angle 511 relative to one of the cardinal directions, such as the cardinal direction associated with the structure 509. The identified structure 504 can be located in an ordinal direction between the cardinal directions associated with structures 503 and 505 and, in some embodiments, the layout characterization tool can measure the ordinal angle 512 relative to one of the cardinal directions, such as the cardinal direction associated with the structure 505. The identified structure 506 can be located in an ordinal direction between the cardinal directions associated with structures 505 and 507 and, in some embodiments, the layout characterization tool can measure the ordinal angle 513 relative to one of the cardinal directions, such as the cardinal direction associated with the structure 505. The identified structure 508 can be located in an ordinal direction between the cardinal directions associated with structures 507 and 509 and, in some embodiments, the layout characterization tool can measure the ordinal angle 514 relative to one of the cardinal directions, such as the cardinal direction associated with the structure 509.

Figure 5B:
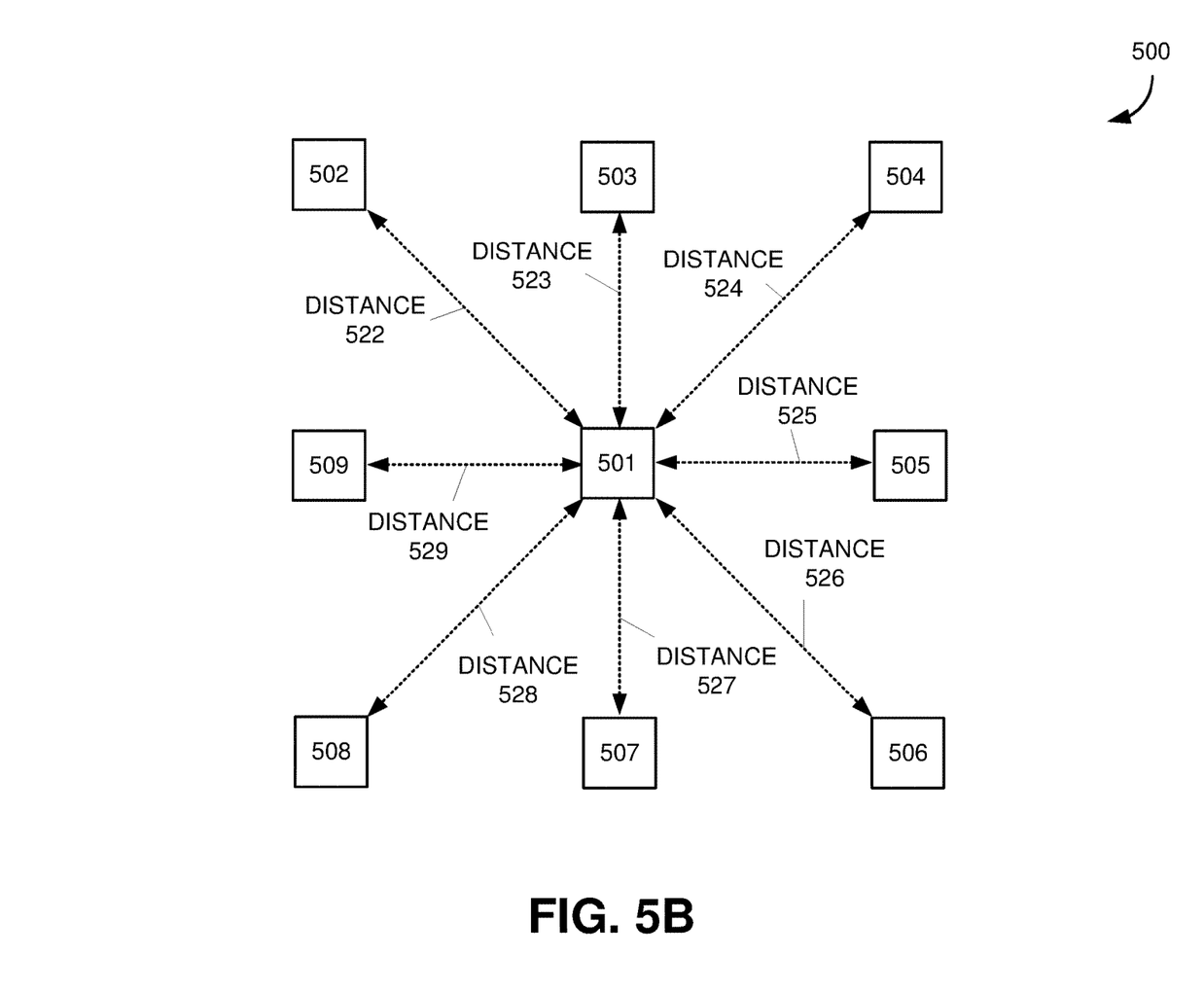

Referring to FIG. 5B, the portion of the physical layout design 500 can be similar to the portion described above with reference to FIG. 5A, as the portion of the physical layout design 500 includes the point of interest 501 and multiple identified structures 502-509 located in different directions around the point of interest 501. The identified structures 503, 505, 507, and 509 can be located in cardinal directions around the point of interest 501, which the identified structures 502, 504, 506, and 508 can be located in ordinal directions around the point of interest 501.

A layout characterization tool can measure distances 522-529 between the point of interest 501 and the identified structures 502-509, respectively. The identified structures 503, 505, 507, and 509 can be located in cardinal direction and thus their corresponding distances 523, 525, 527, and 529, respectively, can be measured by the global position surveying process. In some embodiments, the layout characterization tool can derive the distances 522, 524, 526, and 528 to the structures 502, 504, 506, and 508 using at least some of the distances 523, 525, 527, and 529 and the ordinal angles measured with reference to FIG. 5A. For example, the layout characterization tool can derive the distance 522 as the hypotenuse of a triangle formed using distance 523 or 529 and the ordinal angle associated with the structure 502. The layout characterization tool can derive the distance 524 as the hypotenuse of a triangle formed using distance 523 or 525 and the ordinal angle associated with the structure 504. The layout characterization tool can derive the distance 526 as the hypotenuse of a triangle formed using distance 525 or 527 and the ordinal angle associated with the structure 506. The layout characterization tool can derive the distance 528 as the hypotenuse of a triangle formed using distance 527 or 529 and the ordinal angle associated with the structure 508.

Figure 5C:
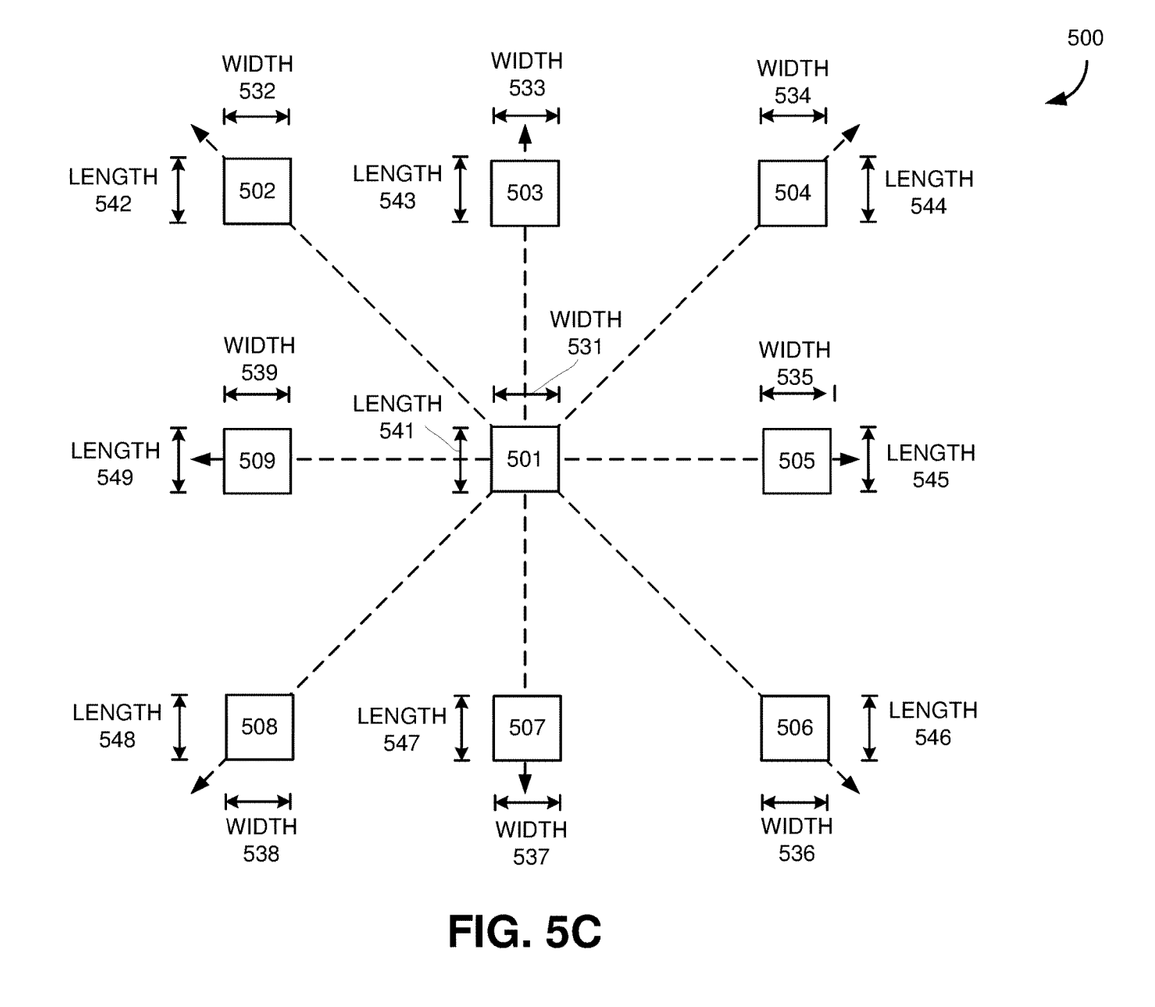

Referring to FIG. 5C, the portion of the physical layout design 500 can be similar to the portion described above with reference to FIGS. 5A and 5B, as the portion of the physical layout design 500 includes the point of interest 501 and multiple identified structures 502-509 located in different directions around the point of interest 501. The identified structures 503, 505, 507, and 509 can be located in cardinal directions around the point of interest 501, which the identified structures 502, 504, 506, and 508 can be located in ordinal directions around the point of interest 501.

A layout characterization tool can measure a width 531 and a length 541 of the point of interest. The layout characterization tool also can measure widths 532-539 and lengths 542=549 of the identified structures 502-509, respectively. For example, the layout characterization tool can measure the width 532 and the length 542 of the structure 502 in the portion of the physical layout design 500. The layout characterization tool can measure the width 533 and the length 543 of the structure 503 in the portion of the physical layout design 500. The layout characterization tool can measure the width 534 and the length 544 of the structure 504 in the portion of the physical layout design 500. The layout characterization tool can measure the width 535 and the length 545 of the structure 505 in the portion of the physical layout design 500. The layout characterization tool can measure the width 536 and the length 546 of the structure 506 in the portion of the physical layout design 500. The layout characterization tool can measure the width 537 and the length 547 of the structure 507 in the portion of the physical layout design 500. The layout characterization tool can measure the width 538 and the length 548 of the structure 508 in the portion of the physical layout design 500. The layout characterization tool can measure the width 539 and the length 549 of the structure 509 in the portion of the physical layout design 500. While FIG. 5C shows the example layout structures 501-509 as being characterized as length and width measurements, in some embodiments, the layout structures 501-509 can have different shapes and sizes, which can allow the layout characterization tool to measure them differently. For example the layout characterization tool can measure a vertical extent, a horizontal extent, a perimeter area, a number of vertices, a length, a width, or the like.

Referring back to FIG. 3, the layout characterization tool 300 can include a pattern matching system 320 to receive the principal feature components 313 from the pattern decomposition system 310. The pattern matching system 320 can generate the characterized layout design 304 based on the physical layout design 301 and the principal feature components 313.

The pattern matching system 320 can include a topological signature system 321 to analyze the topological components of the principal feature components 313, such as the ternary or binary values in the principal feature components 313 corresponding to the identification of structures around the points of interest 302, and generate a topological signature for each of the points of interest 302. In some embodiments, each topological signature can include a series or string of binary or ternary values configured to indicate a presence or lack of presence of structures in the cardinal and ordinal directions around the points of interest 302. For example, when a point of interest has a structure in a cardinal direction to the left, the topological signature can have a binary value or a ternary value associated with the left cardinal direction set to annunciate the presence of the structure.

The topological signature, in some embodiments, can include 8 potential values corresponding to the 4 cardinal directions and the 4 ordinal directions, which can be set to annunciate a presence of a structure in that direction. The values can be binary, for example, a "0" when no structure is present in that direction and a "1" when a structure is present in that direction. The values also can be ternary, which can have an additional value to annunciate an inspection depth for the structures.

Figure 7A:
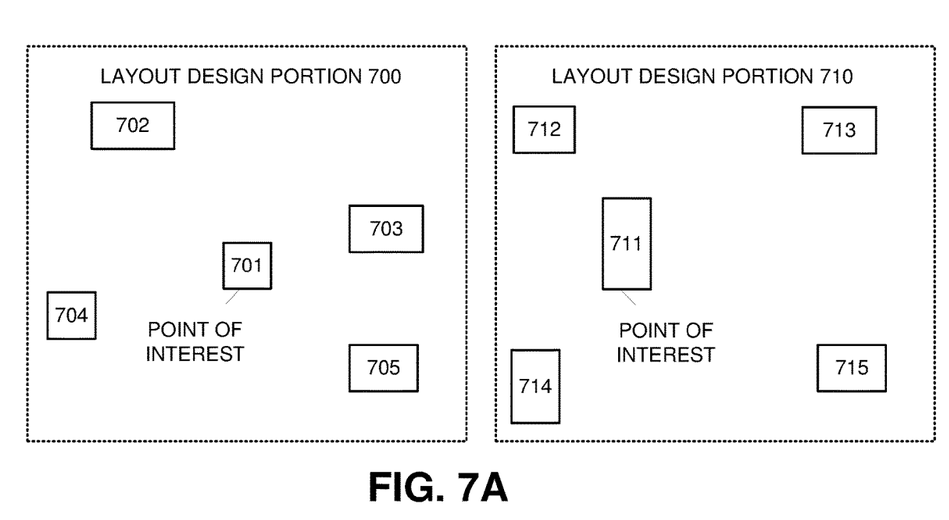
FIGS. 7A and 7B illustrate examples of controlled clustered layout design portions according to various embodiments.

The pattern matching system 320 can include a pattern clustering system 322 to cluster the points of interest 302 based, at least in part, on the topological signature. In some embodiments, the pattern clustering system 322 can group together those points of interest 302 having the same topological signature. Since the topological signatures identify a coarse level detail of the structures around the points of interest 302, for example, identifying whether structures are present around the points of interest in specific cardinal and ordinal directions, the pattern clustering system 322 can perform topological clustering the points of interest 302 into a relatively small set of different clusters. Embodiments of the pattern clustering will be described with reference to FIG. 7A. Referring the FIG. 7A, a pair of layout design portions 720 and 730 are shown as having been clustered based on the topological signatures and, in this example, the ordinal angles of the structures. The layout design portion 720 can include a point of interest 721 and three structures 722-724 arranged around the point of interest 721 at specific ordinal angles. The layout design portion 730 can include a point of interest 731 and three structures 732-734 arranged around the point of interest 731 at specific ordinal angles. The two layout design portions 720 and 730 can be clustered based on the topological signatures and the ordinal angles associated with structures 722-724 and 732-734. The clustering of the layout design portions 720 and 730 can be more refined than the clustering of the layout design portions 700 and 710 described above with reference to FIG. 7A, as not only a presence of the structures, but an ordinal angle of the structure can be utilized to cluster the layout design portions 720 and 730.

Figure 7B:
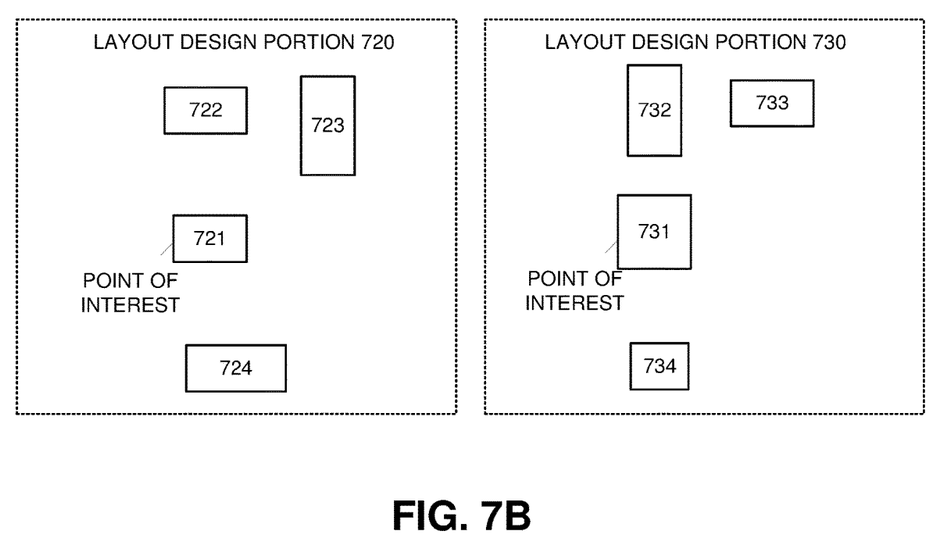

Referring back to FIG. 3, the pattern clustering system 322 also can refine the topological clustering through the use of one or more dimensional components in the principal feature components, such as the ordinal angles, the hypotenuse distances, the length and/or width of the points of interest, the length and/or width of the structures around the points of interest 302, or the like. The pattern clustering system 322 can select the level of granularity to cluster the points of interest 302 by selecting which of the dimensional components to utilize along with the topological clustering based on the topological signature. In some embodiments, the pattern clustering system 322 utilize each of the dimensional components along with the topological clustering to identify exact matches between points of interest 302. In other embodiments, the pattern clustering system 322 utilize a subset of the dimensional components along with the topological clustering to identify fuzzy matches between points of interest 302 having similar topologies. Embodiments of the fuzzy pattern clustering will be described with reference to FIG. 7B. Referring the FIG. 7B, a pair of layout design portions 700 and 710 are shown as having been clustered based on the topological signatures. The layout design portion 700 can include a point of interest 701 and four structures 702-705 arranged around the point of interest 701 in different cardinal and ordinal directions. The layout design portion 710 can include a point of interest 711 and four structures 712-715 arranged around the point of interest 711 in the cardinal and ordinal directions. The two layout design portions 700 and 710 can be clustered based on the topological signatures, which describe a presence of the structures 702-705 and 712-715 relative to the points of interest 701 and 711, respectively.

The pattern clustering system 322 can incorporate the clusters of the points of interest 302—whether corresponding to exact matches, fuzzy matches, or topological matches—into the characterized layout design 304 for use by the downstream physical verification tool 350. The pattern clustering system 322 also can incorporate the topological signature and the dimensional components for the points of interest 302 in the characterized layout design 304, which can allow the downstream physical verification tool 350 or a manufacturing defects verification tool to perform topological clustering, fuzzy clustering, and/or exact matching itself. In some embodiments, the downstream physical verification tool 350 can perform design rule check operations on the characterized layout design 304 to identify one or more design rule violations. The downstream physical verification tool 350 can correlate the design rule violation to one or more of the points of interest 302 and perform pattern matching to identify whether other points of interest match the point of interest corresponding to the design rule violation. By selectively controlling which of the dimensional components to include in the performance of the pattern matching, the downstream physical verification tool 350 can identify the dimensional features that correspond to the design rule violation.

Figure 6:
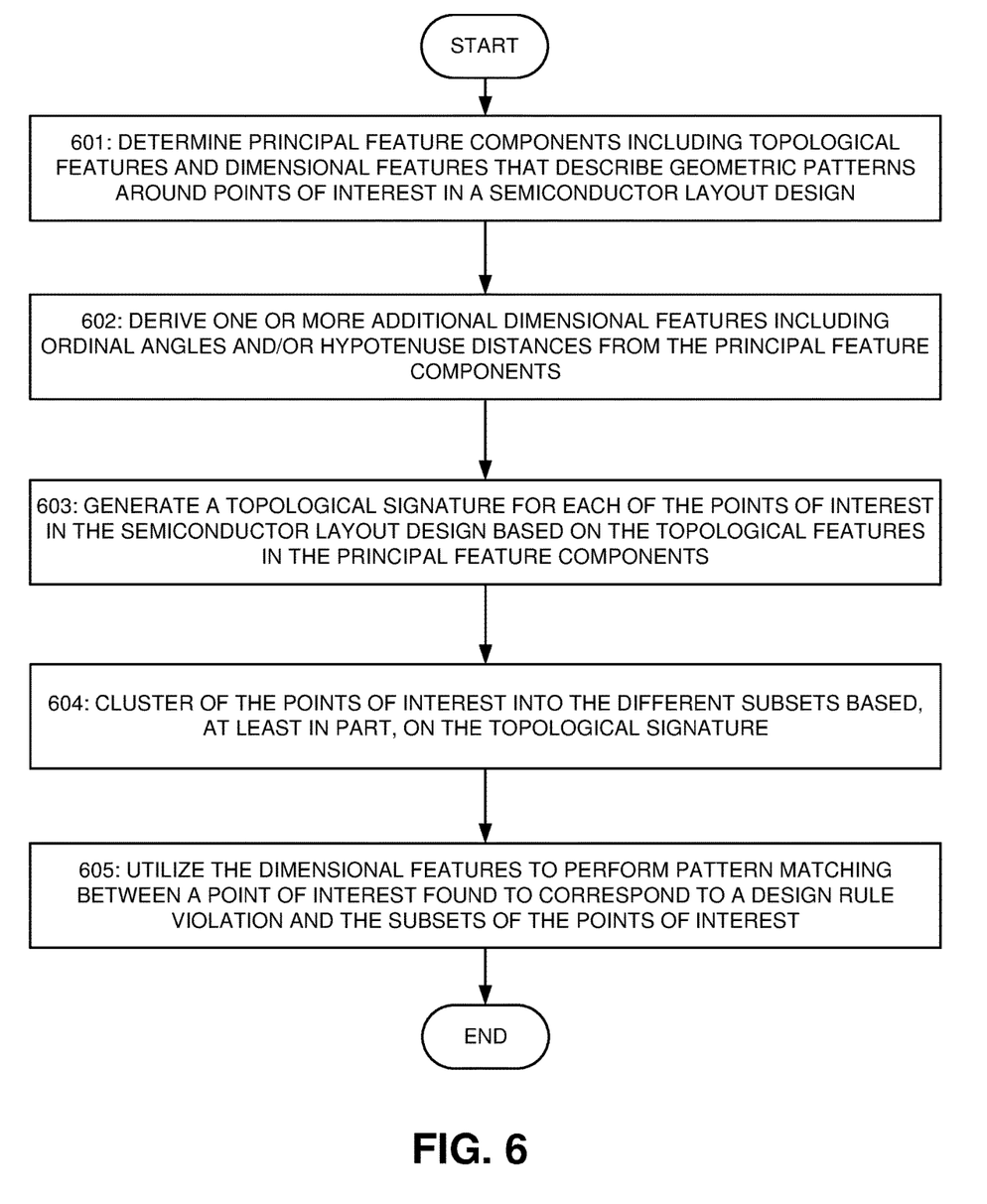
FIG. 6 illustrates an example flowchart for controllable pattern clustering that may be implemented according to various embodiments.

FIG. 6 illustrates an example flowchart for controllable pattern clustering that may be implemented according to various embodiments. Referring to FIG. 6, in a block 601, a computing system implementing a layout characterization tool can determine principal feature components including topological features and dimensional features that describe geometric patterns around points of interest in a semiconductor layout design. The semiconductor layout design can describe an integrated circuit as geometric information defining the shapes, such as polygon structures, capable of being created in various materials to manufacture the integrated circuit. The semiconductor layout design can be specified in a Graphic Data System II (GDSII) format, an Open Access format, a Milkyway format, an EDDM format, an Open Artwork System Interchange Standard (OASIS) format, or the like. The points of interest can correspond to portions of the semiconductor layout design, which may be associated with a hotspot, for example, those structures in the semiconductor layout design that could be difficult to manufacture.

The layout characterization tool can generate the principal feature components having the topological features and the dimensional features for each of the points of interest. The topological features can include information identifying a presence of structures in different directions around the points of interest, for example, expressed as a binary or ternary value. The dimensional features can include information corresponding to measurements of the points of interest and/or of the structures identified by the topological components, for example, expressed as floating point values In a block 602, the computing system implementing the layout characterization tool can derive one or more additional dimensional features from the principal feature components. In some embodiments, the layout characterization tool can measure ordinal angles associated with locations of identified structures and the points of interest. Each ordinal angle can correspond to a measured angle between two cardinal directions that corresponds to a location of an identified structure. The layout characterization tool also can measure distances between the points of interested and the identified structures along the ordinal angles. The layout characterization tool also can measure the size of the points of interest, such as a length and a width of each of the points of interest, and the size of the identified structures, such as a length and a width of each of the identified structures. The layout characterization tool can add those dimensional features to the principal feature components of the points of interest.

In a block 603, the computing system implementing the layout characterization tool can generate a topological signature for each of the points of interest in the semiconductor layout design based on the topological features in the principal feature components. In some embodiments, each topological signature can include a series or string of binary or ternary values configured to indicate a presence or lack of presence of structures in the cardinal and ordinal directions around the points of interest. For example, when a point of interest has a structure in a cardinal direction to the right, the topological signature can have a binary value or a ternary value associated with the right cardinal direction set to annunciate the presence of the structure. The topological signature, in some embodiments, can include 8 potential values corresponding to the 4 cardinal directions and the 4 ordinal directions, which can be set to annunciate a presence of a structure in that direction. The values can be binary, for example, a "0" when no structure is present in that direction and a "1" when a structure is present in that direction. The values also can be ternary, which can have an additional value to annunciate an inspection depth for the structures.

In a block 604, the computing system implementing the layout characterization tool can cluster of the points of interest into the different subsets based, at least in part, on the topological signature. In some embodiments, the layout characterization tool can group together those points of interest having the same topological signature, for example, utilizing a numerical sorting of the topological signatures for the points of interest. This conversion of the clustering task into a numerical sorting of topological signatures can allow the computing system to perform the clustering with less computation. Since the topological signatures identify a coarse level detail of the structures around the points of interest, for example, identifying whether structures are present around the points of interest in specific cardinal and ordinal directions, the layout characterization tool can perform topological clustering the points of interest into a relatively small set of different clusters.

In a block 605, the computing system implementing the layout characterization tool or a downstream physical verification tool can utilize the dimensional features to perform pattern matching between a point of interest found to correspond to a design rule violation and the subsets of the points of interest. The computing system can correlate the design rule violation to one or more of the points of interest and perform pattern matching to identify whether other points of interest match the point of interest corresponding to the design rule violation. By selectively controlling which of the dimensional components to include in the performance of the pattern matching, the computing system can identify the dimensional features that correspond to the design rule violation, while also identifying which other points of interest correspond to the design rule violation.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to design processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   determining, by a computing system, principal feature components that describe geometric patterns around points of interest in a semiconductor layout design, wherein the principal feature components include a plurality of topological features for each of the points of interest in the semiconductor layout design, which indicate whether structures are present in different directions around the points of interest, wherein the principal feature components include a plurality of dimensional features for each of the points of interest in the semiconductor layout design, which correspond to measurements associated with the points of interest or the structures present around the points of interest;
   generating, by the computing system, a topological signature for each of the points of interest in the semiconductor layout design based on the topological features in the principal feature components;
   selecting, by the computing system, one or more of the dimensional features for each of the points of interest in the semiconductor layout design, wherein the selection corresponds to a level of granularity to cluster the points of interest;
   performing, by the computing system, topological clustering for the points of interest, which groups the points of interest into subsets based, at least in part, on the topological signature; and
   refining, by the computing system, the topological clustering of the points of interest by clustering the points of interest into different subsets based, at least in part, on the selected dimensional features.

2. The method of claim 1, wherein the dimensional features include ordinal angles between the different directions around the points of interest corresponding to the topological features.

3. The method of claim 1, wherein the dimensional features include hypotenuse distances corresponding to distances between the points of interest and the structures that the topological features indicate were present around the points of interest.

4. The method of claim 1, further comprising:
   performing, by the computing system, design rule check operations on the semiconductor layout design to identify whether one or more of the points of interest correspond to a design rule violation; and
   performing, by the computing system, pattern matching to identify whether any of the points of interest match the one or more of the points of interest corresponding to the design rule violation based, at least in part, on the dimensional features.

5. The method of claim 4, wherein the pattern matching identifies which of the dimensional features corresponds to the design rule violation.

6. The method of claim 1, wherein the points of interest comprises edges in the semiconductor layout design.

7. A system comprising:
   a memory system configured to store computer-executable instructions; and
   a computing system, in response to execution of the computer-executable instructions, is configured to:
       determine principal feature components that describe geometric patterns around points of interest in a semiconductor layout design, wherein the principal feature components include a plurality of topological features for each of the points of interest in the semiconductor layout design, which indicate whether structures are present in different directions around the points of interest, wherein the principal feature components include a plurality of dimensional features for each of the points of interest in the semiconductor layout design, which correspond to measurements associated with the points of interest or the structures present around the points of interest;

generate a topological signature for each of the points of interest in the semiconductor layout design based on the topological features in the principal feature components;

select one or more of the dimensional features for each of the points of interest in the semiconductor layout design, wherein the selection corresponds to a level of granularity to cluster the points of interest;

perform topological clustering for the points of interest, which groups the points of interest into subsets based, at least in part, on the topological signature; and refine the topological clustering of the points of interest by clustering the points of interest into different subsets based, at least in part, on the selected dimensional features.

8. The system of claim 7, wherein the dimensional features include ordinal angles between the different directions around the points of interest corresponding to the topological features.

9. The system of claim 7, wherein the dimensional features include hypotenuse distances corresponding to distances between the points of interest and the structures that the topological features indicate were present around the points of interest.

10. The system of claim 7, wherein the computing system, in response to execution of the computer-executable instructions, is further configured to:

perform design rule check operations on the semiconductor layout design to identify whether one or more of the points of interest correspond to a design rule violation; and perform pattern matching to identify whether any of the points of interest match the one or more of the points of interest corresponding to the design rule violation based, at least in part, on the dimensional features.

11. The system of claim 10, wherein the pattern matching identifies which of the dimensional features corresponds to the design rule violation.

12. An apparatus comprising at least one computer-readable memory device storing instructions configured to cause one or more processing devices to perform operations comprising:

determining principal feature components that describe geometric patterns around points of interest in a semiconductor layout design, wherein the principal feature components include a plurality of topological features for each of the points of interest in the semiconductor layout design, which indicate whether structures are present in different directions around the points of interest, wherein the principal feature components include a plurality of dimensional features for each of the points of interest in the semiconductor layout design, which correspond to measurements associated with the points of interest or the structures present around the points of interest;

generating a topological signature for each of the points of interest in the semiconductor layout design based on the topological features in the principal feature components;

selecting one or more of the dimensional features for each of the points of interest in the semiconductor layout design, wherein the selection corresponds to a level of granularity to cluster the points of interest;

performing topological clustering for the points of interest, which groups the points of interest into subsets based, at least in part, on the topological signature; and refining the topological clustering of the points of interest by clustering the points of interest into different subsets based, at least in part, on the selected dimensional features.

13. The apparatus of claim 12, wherein the dimensional features include ordinal angles between the different directions around the points of interest corresponding to the topological features.

14. The apparatus of claim 12, wherein the dimensional features include hypotenuse distances corresponding to distances between the points of interest and the structures that the topological features indicate were present around the points of interest.

15. The apparatus of claim 12, wherein the instructions are configured to cause one or more processing devices to perform operations further comprising:

performing design rule check operations on the semiconductor layout design to identify whether one or more of the points of interest correspond to a design rule violation; and performing pattern matching to identify whether any of the points of interest match the one or more of the points of interest corresponding to the design rule violation based, at least in part, on the dimensional features.

16. The apparatus of claim 15, wherein the pattern matching identifies which of the dimensional features corresponds to the design rule violation.

17. The apparatus of claim 12, wherein the points of interest comprises edges in the semiconductor layout design.

* * * * *